United States Patent
Pnini

(10) Patent No.: US 11,460,780 B2
(45) Date of Patent: Oct. 4, 2022

(54) METHOD FOR ADUSTING A FIRST ELEMENT OF A LITHOGRAPHY APPARATUS TOWARDS A SECOND ELEMENT OF A LITHOGRAPHY APPARATUS BY A TUNABLE SPACER

(71) Applicant: Carl Zeiss SMT GmbH, Oberkochen (DE)

(72) Inventor: Boaz Pnini, Goeggingen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 17/228,150

(22) Filed: Apr. 12, 2021

(65) Prior Publication Data

US 2021/0232051 A1    Jul. 29, 2021

Related U.S. Application Data

(63) Continuation of application No. PCT/EP2019/078734, filed on Oct. 22, 2019.

(30) Foreign Application Priority Data

Oct. 23, 2018  (DE) .......................... 102018218110.1

(51) Int. Cl.
*G03F 7/20* (2006.01)
*G02B 7/02* (2021.01)
(Continued)

(52) U.S. Cl.
CPC ......... *G03F 7/70258* (2013.01); *G02B 7/023* (2013.01); *G02B 7/1825* (2013.01); *G02B 27/0983* (2013.01); *G03F 7/70833* (2013.01)

(58) Field of Classification Search
CPC .......... G02B 7/02; G02B 7/021; G02B 7/023; G02B 7/022; G02B 7/10; G02B 3/00;
(Continued)

(56) References Cited

U.S. PATENT DOCUMENTS

| 4,858,865 A | 8/1989 | Schrepfer |
| 2008/0204904 A1* | 8/2008 | Mizuno .................. G02B 7/005 359/811 |

(Continued)

FOREIGN PATENT DOCUMENTS

| CN | 107290933 A | 10/2017 |
| DE | 10 2014 225 199 A1 | 6/2016 |

(Continued)

OTHER PUBLICATIONS

International Search Report and Written Opinion for corresponding PCT Appl No. PCT/EP2019/078734, dated Jan. 23, 2020.

*Primary Examiner* — Mesfin T Asfaw
(74) *Attorney, Agent, or Firm* — Fish & Richardson P.C.

(57) ABSTRACT

A method adjusts a first element of a lithography apparatus toward a second element of the lithography apparatus via a tunable spacer which is arranged between the first element and the second element. The method includes: determining an actual location of the first element; determining a nominal location of the first element; unloading the tunable spacer; adjusting a height of the tunable spacer to bring the first element from the actual location to the nominal location; and loading the tunable spacer.

20 Claims, 11 Drawing Sheets

(51) Int. Cl.
*G02B 7/182* (2021.01)
*G02B 27/09* (2006.01)

(58) Field of Classification Search
CPC .......... G02B 7/003; G02B 7/08; G02B 7/026;
G02B 7/028; G02B 13/002; G02B
13/003; G02B 13/0045; G02B 27/646;
G02B 27/017
See application file for complete search history.

(56) References Cited

U.S. PATENT DOCUMENTS

| | | |
|---|---|---|
| 2010/0128237 A1 | 5/2010 | Okamoto et al. |
| 2012/0299208 A1 | 11/2012 | Hansen et al. |
| 2015/0033886 A1* | 2/2015 | Okamoto ................ F16H 25/12 |
| | | 74/89.23 |

FOREIGN PATENT DOCUMENTS

| | | |
|---|---|---|
| EP | 0 177 815 A2 | 4/1986 |
| TW | 446829 B | 7/2001 |
| WO | WO 2016/091616 A1 | 6/2016 |

* cited by examiner

METHOD FOR ADUSTING A FIRST ELEMENT OF A LITHOGRAPHY APPARATUS TOWARDS A SECOND ELEMENT OF A LITHOGRAPHY APPARATUS BY A TUNABLE SPACER

CROSS-REFERENCE TO RELATED APPLICATIONS

The present application is a continuation of, and claims benefit under 35 USC 120 to, international application PCT/EP2019/078734, filed Oct. 22, 2019, which claims benefit under 35 USC 119 of German Application No. 10 2018 218 110.1 filed Oct. 23, 2018. The entire disclosure of these applications are incorporated by reference herein.

FIELD

The present disclosure relates to a method of adjusting a first element of a lithography apparatus toward a second element of the lithography apparatus.

BACKGROUND

Microlithography can be used for producing microstructured components, for example integrated circuits. The microlithography process can be performed using a lithography apparatus, which has an illumination system and a projection system. The image of a mask (reticle) illuminated via the illumination system can be projected via the projection zo system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range from 0.1 nm to 30 nm, such as 13.5 nm. In the case of such EUV lithography apparatuses, because of the high absorption of light of this wavelength by most materials, reflective optical units, that is to say mirrors, are typically used instead of refractive optical units, such as lens elements.

Before a lithography apparatus of this kind is used, it is generally desirable to adjust elements, for example the aforementioned optical units. This adjustment can be effected, for example, with the aid of spacing elements or spacers. For this purpose, desired thicknesses or heights of such spacer elements can first be determined, for example with the aid of a virtual mounting model or with the aid of short-circuit measurements. In order to avoid long processing times, for example on account of the grinding of the spacers, a modular system of spacers of very different heights or thicknesses can be used. The spacers can be ground with an accuracy of ±2 µm, in order to achieve the desired process tolerances. On account of the small increments of 10 µm and the usual desire for a large adjustment range of up to 0.5 mm, it is often desirable to make available a large number of spacers. The handling and the logistics of the spacers can be complicated, which can drive up the costs. The production and cleaning of high-precision spacers can be relatively complex.

SUMMARY

The present disclosure seeks to provide an improved method for adjusting elements of a lithography apparatus.

In a general aspect, the disclosure provides a method for adjusting a first element of a lithography apparatus toward a second element of the lithography apparatus via a tunable spacer which is arranged between the first element and the second element. The method includes: a) determining an actual location of the first element; b) determining a nominal location of the first element; c) unloading the tunable spacer; d) adjusting a height of the tunable spacer in order to bring the first element from the actual location into the nominal location; and e) loading the tunable spacer.

Due to the fact that the height of the tunable spacer can be adjusted, it is possible to bring the first element from the actual location into the nominal location without the use of a plurality of spacers of different heights.

The first element can be an optical element like a mirror which is carried or supported by the second element. The first element can also be a lens. For example, the second element can be a force frame of the lithography apparatus. The tunable spacer being arranged "between" the first element and the second element in this context means that the tunable spacer is sandwiched between the two elements. For example, the tunable spacer can be fixed to the first element and/or to the second element. Optionally, the tunable spacer is not removed from the elements for adjusting the height thereof. Optionally, the first element, the second element and the tunable spacer are part of an optical system of the lithography apparatus. The optical system can be a projection system of the lithography apparatus. The optical system can include a plurality of tunable spacers.

The first element can have a coordinate system with an x direction, an y direction and a z direction, with the directions arranged perpendicular to each other. The x direction can be named first spatial direction, the z direction can be named second spatial direction and the y direction can be named third spatial direction. The first element can have six degrees of freedom, namely three translational degrees of freedom along the x direction, the y direction and the z direction, respectively, and three rotational degrees of freedom about the x direction, the y direction and the z direction, respectively. In other words, a position and an orientation of the first element can be determined or described with the aid of the six degrees of freedom.

The "position" of the first element is to be understood in particular as its coordinates or the coordinates of a measurement point provided on the first element with respect to the x direction, the y direction and the z direction. The "orientation" of the first element is to be understood in particular as its tilt with respect to the three spatial directions. In other words, the first element can be tilted about the x direction, the y direction and/or the z direction. This gives the six degrees of freedom for the position and/or orientation of the first element. A "location" of the first element includes both its position and its orientation. The location of the first element can be adjusted with the aid of a plurality of tunable spacers. In the present case, "adjusting" can be understood as bringing the first element from its actual location to its nominal location.

"Unloading" in this context means that a weight that rests on the tunable spacer, for example a weight of the first element and/or a weight of other elements of the lithography apparatus, is removed or lifted or at least partly removed or lifted so that the height of the tunable spacer can be adjusted. "Loading" in this context means that the weight is put back on the tunable spacer after adjusting the height thereof. For example, the height is measured along the z-direction. Optionally, in c) the tunable spacer is unloaded from the weight of the first element, wherein in e) the tunable spacer is again loaded with the weight of the first element. "Adjusting" the height in this context means, that the height is increased or decreased as needed to reach the nominal location of the first element.

According to some embodiments, in d) the height of the tunable spacer is adjusted stepless.

"Stepless" in this context means that there are no increments as needed with conventional non-tunable spacers.

According to some embodiments, in c) the first element is lifted from the tunable spacer.

"Lifted" in this context can mean that the first element is removed from the tunable spacer so that there is a gap between the tunable spacer and the first element. However, "lifted" can also mean that the first element is still in contact with the tunable spacer but the weight does not load or does at least partly not load the tunable spacer.

According to some embodiments, in e) the first element is settled on the tunable spacer.

"Settled" means that the first element is in contact with the tunable spacer and the weight thereof rests completely on the tunable spacer.

According to some embodiments, in a) the actual location of the first element is measured or calculated.

This can be done with the aid of a virtual assembly model or with the aid of short-circuit measurements. A "short-circuit measurement" is to be understood in the present case as meaning that the optical system including the two elements and the tunable spacer is assembled completely with standard or nominal spacers and then measured.

According to some embodiments, in b) the nominal location of the first element is calculated.

The nominal position can be calculated, for example, with the aid of a correction recipe.

According to some embodiments, in d) the height of the tunable spacer is adjusted via a gear mechanism which is part of the tunable spacer.

For example, the gear mechanism can include inclined gliding surfaces of a displacement element and a housing element of the tunable spacer.

According to some embodiments, in d) the height of the tunable spacer is adjusted by a linear movement of a displacement element of the tunable spacer relatively toward a housing element of the tunable spacer along a first spatial direction.

Optionally, the height is oriented perpendicular toward the first spatial direction or x-direction.

According to some embodiments, in d) the gear mechanism transfers the linear movement of the displacement element along the first spatial direction into a linear movement of the displacement element along a second spatial direction that differs from the first spatial direction.

For example, the second spatial direction is the z-direction. The height of the tunable spacer is measured along the z-direction.

According to some embodiments, in d) during the linear movement of the displacement element relatively toward the housing element, an inclined gliding surface of the displacement element glides on an inclined gliding surface of the housing element.

Optionally, the displacement element and the housing element are wedge-shaped.

According to some embodiments, in d) the displacement element is moved relatively toward the housing element along the first spatial direction via an adjustment element.

The adjustment element can be a screw, a threaded rod or the like.

According to, in d) the tunable spacer is brought from a non-deflected status into a deflected status, wherein the height in the deflected status is bigger than in the non-deflected status.

For example, the tunable spacer can be brought from the non-deflected status into the deflected status in a stepless way. That means no fixed increments are needed.

According to some embodiments, throughout a) to e) the tunable spacer remains between the first element and the second element.

Alternatively, the tunable spacer can be removed for adjusting the height of the tunable spacer. However, it can be desirable for the tunable spacer to be left between the first element and the second element during adjusting the height.

According to some embodiments, in e) the tunable spacer is force-free.

"Force-free" in this context means that no force, for example the weight of the first element, acts on the tunable spacer along the height or along the z-direction.

According to some embodiments, in a) the actual location of the first element is determined in relation to the second element.

The second element can also be adjusted.

In another aspect, the disclosure provides a tunable spacer for an optical system or for a lithography apparatus. The tunable spacer includes a housing element, a displacement element, which is linearly displaceable relative to the housing element, and a gear mechanism, which is designed to convert a linear movement of the displacement element relative to the housing element in a first spatial direction into a linear movement of the housing element in a second spatial direction differing from the first spatial direction, in order to bring the tunable spacer steplessly from a non-deflected state to a deflected state and vice versa.

In some embodiments, because the tunable spacer can be brought steplessly from the non-deflected state to the deflected state and vice versa, the accuracy of an adjustment of the height or thickness of the tunable spacer is not achieved through high-precision and therefore expensive production, but instead with the aid of a non-sensitive adjustment mechanism in the form of a gear mechanism. For example, the accuracy of the adjustment of the height or thickness of the tunable spacer can be achieved by the fact that the displacement element and/or the housing element has a shallow angle of inclination or wedge angle. Here, "shallow" is to be understood in particular as an angle of inclination or wedge angle that is smaller than 10°. It is not necessary to exchange the tunable spacer in order to adjust its height. With the tunable spacer, it is possible to achieve at least the same adjustment accuracy, that is to say the graduation of the height, as is possible with the known modular concept.

The tunable spacer can also be designated as an adjustable spacer. The tunable spacer can also be designated as a spacing element. With the aid of the gear mechanism, it is possible to adjust a height or thickness of the tunable spacer, such as in the second spatial direction. For example, the height or thickness can be greater in the deflected state than in the non-deflected state. The tunable spacer can be assigned a coordinate system with an x direction, a y direction oriented perpendicular to the x direction, and a z direction oriented perpendicular to the x direction and perpendicular to the y direction. This coordinate system can be the same as the afore-mentioned coordinate system of the first element. The directions can also be designated as spatial directions. The aforementioned first spatial direction is, for example, the x direction. The aforementioned second spatial direction can be the z direction. The second spatial direction can also be designated as a vertical direction, height direction or thickness direction of the tunable spacer.

In the present text, a "linear movement" is to be understood as a movement along and/or parallel to the corresponding spatial direction. The non-deflected state can also be designated as the non-deflected position, retracted state or retracted position. The deflected state can also be designated as the deflected position, deployed state or deployed position. The non-deflected state and the deflected state can represent end states or end positions of the tunable spacer. The fact that the tunable spacer can be brought "steplessly" from the non-deflected state to the deflected state and vice versa is to be understood in particular as meaning that any desired number of adjustable intermediate positions or intermediate states can be provided between the non-deflected state and the deflected state. The height or thickness of the tunable spacer can be adjusted steplessly between the non-deflected state and the deflected state.

The displacement element can be received at least partially inside the housing element. During the linear movement of the displacement element relative to the housing element, the displacement element can slide on the housing element. For example, the housing element can move linearly relative to the displacement element in the second spatial direction.

According to some embodiments, the gear mechanism has a gliding surface provided on the housing element, and a gliding surface provided on the displacement element, wherein the gliding surfaces slide on each other as the tunable spacer is brought from the non-deflected state to the deflected state and vice versa.

The gliding surfaces can also be referred to as gliding planes. The gliding surfaces can be slanting planes. That is to say, the gliding surfaces can be inclined. The displacement element can include one gliding surface, or it can also have two gliding surfaces, which can then be arranged with mirror symmetry in relation to a plane of symmetry of the displacement element. In the case where the displacement element includes two gliding surfaces, two housing elements can be provided, which each have a gliding surface. That is to say, each gliding surface of the displacement element can then be assigned a housing element.

According to some embodiments, the gliding surfaces are each inclined at an angle of inclination, wherein the angle of inclination is smaller than 10°, such as between 5° and 8°.

All the inclination angles can be the same size. In general, the smaller the angle of inclination, the greater the accuracy of the adjustment of the height or thickness of the tunable spacer. The angle of inclination can also be designated as a wedge angle.

According to some embodiments, the tunable spacer further includes a spring element, wherein the spring element pretensions the tunable spacer in the direction of the non-deflected state.

For example, the spring element can pretension the displacement element with respect to the housing element. That is to say, the spring element can be positioned between the displacement element and the housing element. For example, the spring element can be relaxed or uncompressed in the non-deflected state and is tensioned or compressed in the deflected state. The spring element can be a cylindrical spring, such as a compression spring. However, the spring element can also be a structural part produced from a plastics material, for example from an elastomer.

According to some embodiments, the housing element and the displacement element each have a receiving region, wherein the spring element is received in the receiving regions.

The receiving region of the housing element can be semi-cylindrical. For example, the receiving region can be provided in or on the gliding surface of the housing element. The receiving region of the displacement element can be configured as a recess extending through the gliding surface or the gliding surfaces. For example, the receiving region of the displacement element can be rectangular.

According to some embodiments, the tunable spacer moreover includes a first housing element and a second housing element, wherein the displacement element is arranged between the housing elements.

The first housing element can be assigned a first gliding surface. Accordingly, the second housing element can be assigned a second gliding surface. As the tunable spacer is brought from the non-deflected state to the deflected state, and vice versa, the first gliding surface of the first housing element can slide on a first gliding surface of the displacement element, and the second gliding surface of the second housing element can slide on a second gliding surface of the displacement element.

According to some embodiments, the displacement element is wedge-shaped, wherein the displacement element is configured with mirror symmetry in relation to a plane of symmetry.

The displacement element can also be designated as a wedge element. The two gliding surfaces can be positioned with mirror symmetry in relation to the plane of symmetry.

According to some embodiments, the first housing element and the second housing element are arranged with mirror symmetry in relation to the plane of symmetry.

The first housing element and the second housing element can be of identical configuration. This can reduce the costs involved in producing the tunable spacer.

According to some embodiments, the first housing element and the second housing element move away from each other in the second spatial direction as the tunable spacer is brought from the non-deflected state to the deflected state, wherein the first housing element and the second housing element move towards each other in the second spatial direction as the tunable spacer is brought from the deflected state to the non-deflected state.

For example, as the tunable spacer can be brought from the non-deflected state to the deflected state, and vice versa. The housing elements thus can each perform a synchronized movement.

According to some embodiments, the first housing element and the second housing element are guided linearly on each other with the aid of guide rails.

The guide rails can also be designated as guide surfaces or guide walls. For example, the first housing element and the second housing element can be guided linearly on each other along the second spatial direction with the aid of the guide rails. In this way, twisting of the housing elements relative to each other can be avoided.

According to some embodiments, the tunable spacer moreover includes an adjustment element, which is designed to shift the displacement element in the first spatial direction linearly relative to the housing element.

The adjustment element can be part of the gear mechanism. The adjustment element can be provided laterally on the tunable spacer. A lateral access to the adjustment element can therefore be sufficient to bring the tunable spacer from the non-deflected state to the deflected state and vice versa.

The adjustment element can be a screw. The adjustment element can be designed to engage with positive locking in the displacement element. For this purpose, the displacement element can include a threaded bore into which the adjustment element is screwed. A positively locking connection can arise as a result of at least two connection partners, in this case the adjustment element and the threaded bore, engaging into or behind one another. The housing element can include a rear wall with a perforation through which the adjustment element is guided. The adjustment element can thus be mounted rotatably on the rear wall. With the aid of the adjustment element, the displacement element can be shifted linearly with respect to the housing element counter to the spring force of the spring element. Two adjustment elements can be provided. The adjustment elements can be positioned spaced apart from each other in the y direction. To bring the tunable spacer from the non-deflected state to the deflected state, the adjustment elements can be alternately actuated, such as tightened.

According to some embodiments, a displacement path of the displacement element in the first spatial direction is greater than a height change of the tunable spacer in the second spatial direction, wherein the displacement path is 3 times to 15 times (e.g., 6 times to 12 times, 10 times) the height change.

In this way, the height change can be made with a very high degree of precision. In general, the smaller the angle of inclination of the gliding surfaces, the greater the ratio of the displacement path to the height change. The height change can also be referred to as the thickness change. The height change can be calculated as follows: $\Delta h = 2 \tan \beta 1 \Delta x$. Here, $\Delta h$ is the height change, $\beta 1$ the angle of inclination and $\Delta x$ the displacement path.

According to some embodiments, the tunable spacer includes a perforation, wherein the perforation completely perforates the tunable spacer in the second spatial direction in order to receive a fastening element, such as a screw.

That is to say, the fastening element can be guided through the tunable spacer. By virtue of the fact that the fastening element is guided through the tunable spacer, it is possible, compared to an arrangement in which the fastening element is guided laterally past the tunable spacer, to prevent flexural loading of an element adjusted with the aid of the tunable spacer.

In a general aspect, the disclosure provides an optical system for a lithography apparatus. The optical system includes an element, such as an optical element, and a tunable spacer, wherein the element can be brought from an actual position to a desired position with the aid of the tunable spacer being brought from the non-deflected state to the deflected state.

The element can be, for example, a mirror, a lens element, a stop, and end stop, a force frame or the like. The optical system can be a projection system of a lithography apparatus. The optical system can include a plurality of tunable spacers.

In a general aspect, the disclosure provides a lithography apparatus with a tunable spacer and/or with an optical system.

The lithography apparatus can include a plurality of tunable spacers and/or a plurality of optical systems. The lithography apparatus can be a EUV lithography apparatus. EUV stands for "extreme ultraviolet" and denotes a wavelength of the working light of between 0.1 nm and 30 nm. The lithography apparatus can also be a DUV lithography apparatus. DUV stands for "deep ultraviolet" and denotes a wavelength of the working light of between 30 nm and 250 nm.

"A(n)" in the present case should not necessarily be understood as restrictive to exactly one element. Rather, a plurality of elements, such as, for example, two, three or more, can also be provided. Any other numeral used here should not be understood to the effect that an exact restriction to exactly the corresponding number of elements is to be realized. Rather, numerical deviations upwards and downwards are possible.

The embodiments and features described in respect of the method apply accordingly to the tunable spacer, the optical system and/or the lithography apparatus and vice versa.

Further possible implementations of the disclosure also include not explicitly mentioned combinations of features or embodiments that are described above or below with respect to the illustrative embodiments. In this case, a person skilled in the art will also add individual aspects as improvements or supplementations to the respective basic form of the disclosure.

Further advantageous configurations and aspects of the disclosure are the subject matter of the dependent claims and also of the illustrative embodiments of the disclosure described below.

BRIEF DESCRIPTION OF THE DRAWINGS

In the text that follows, the disclosure is explained in more detail on the basis of illustrative embodiments and with reference to the accompanying figures.

DETAILED DESCRIPTION OF ILLUSTRATIVE EMBODIMENTS

Identical elements or elements having an identical function have been provided with the same reference signs in the figures, unless indicated to the contrary. It should also be noted that the illustrations in the figures are not necessarily true to scale.

Figure 1A:
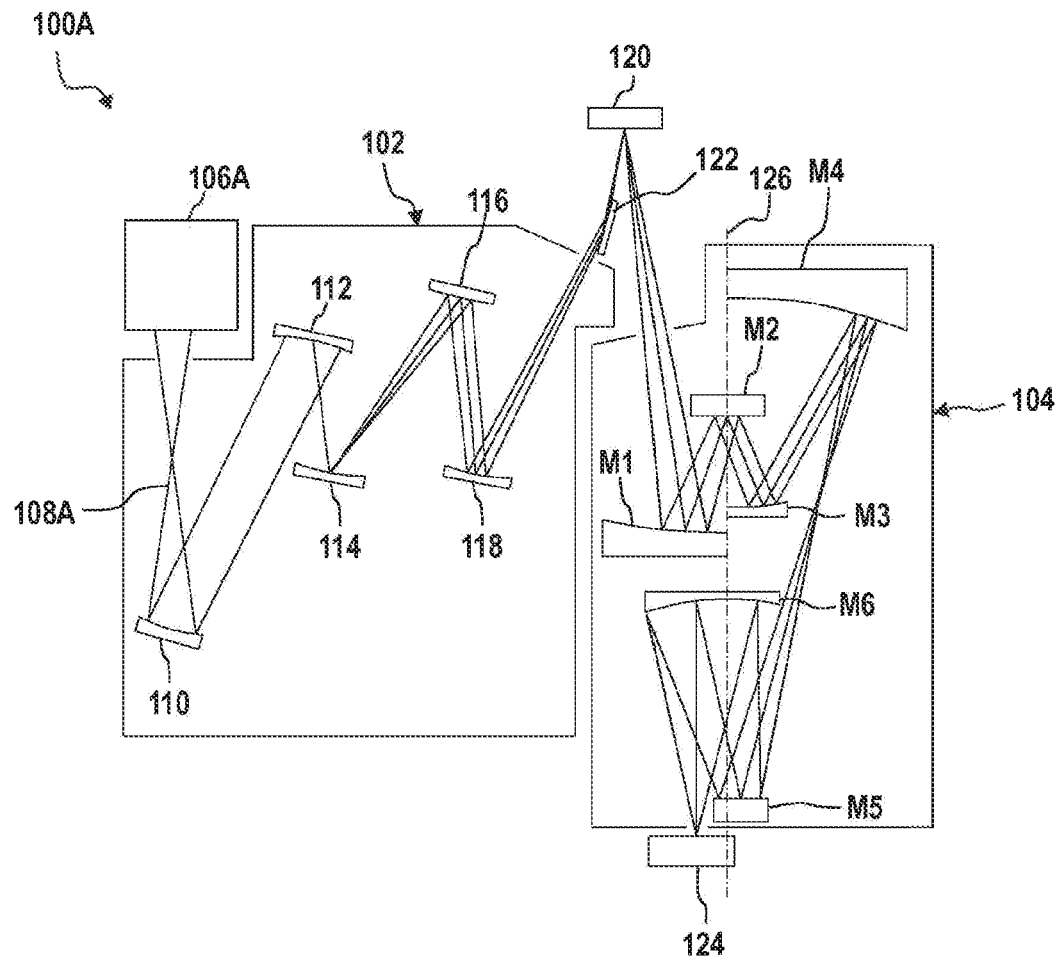
FIG. 1A shows a schematic view of an embodiment of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front face for beam shaping.

Figure 1B:
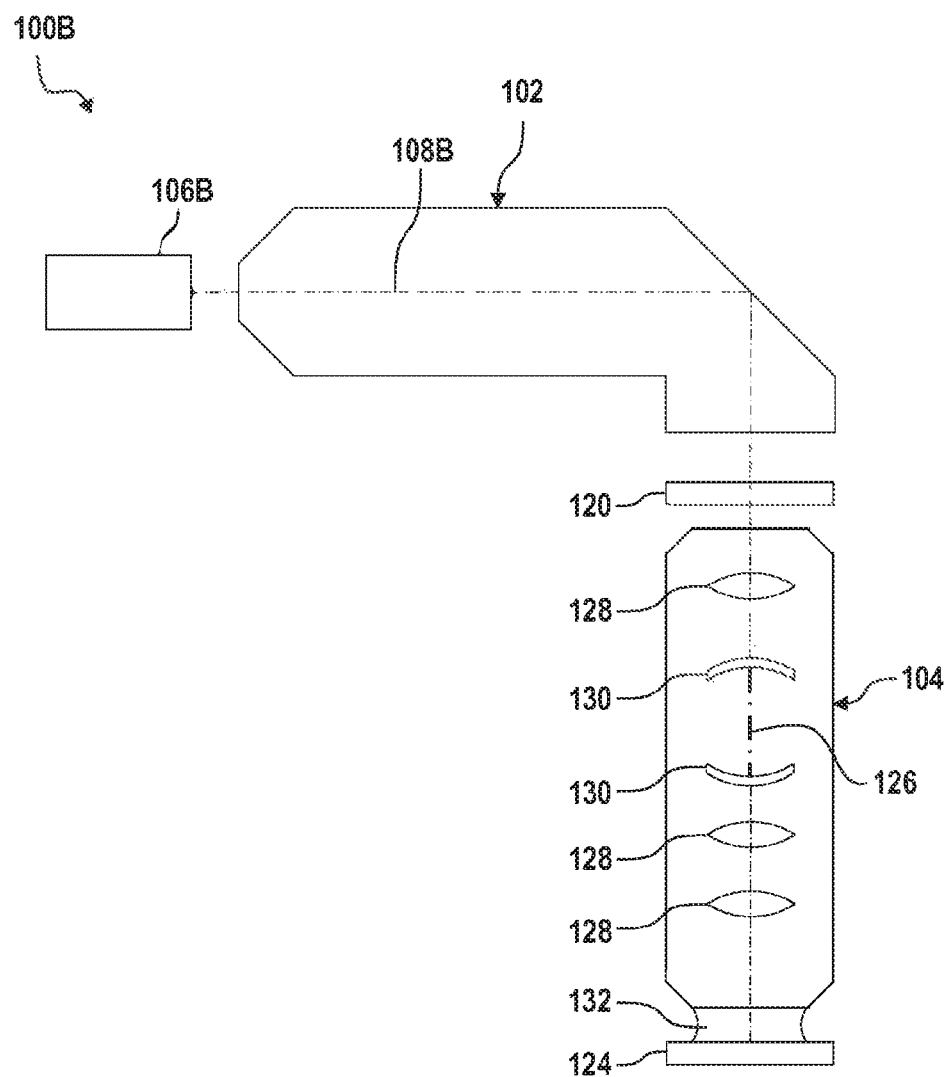
FIG. 1B shows a schematic view of an embodiment of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front face for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Figure 2:
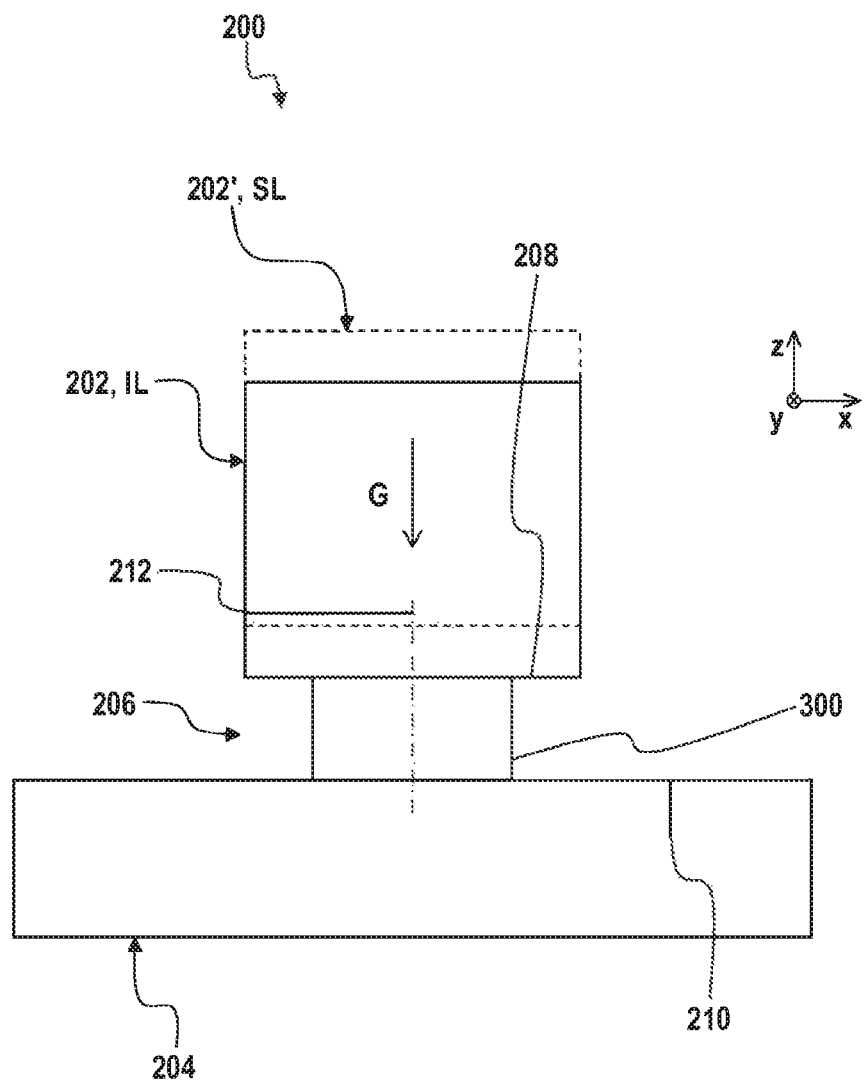
FIG. 2 shows a schematic view of an embodiment of an optical system for the EUV lithography apparatus according to FIG. 1A or for the DUV lithography apparatus according to FIG. 1B.

FIG. 2 shows an optical system 200. The optical system 200 can be part of an EUV lithography apparatus 100A or of a DUV lithography apparatus 100B. For example, the optical system 200 can be part of a projection system 102 or can be a projection system 102, for example of an EUV lithography apparatus 100A. In the text below, the optical system 200 is explained only with reference to an EUV lithography apparatus 100A. However, the optical system 200 can also be used in a DUV lithography apparatus 100B.

The optical system 200 includes a first element 202. The first element 202 can be, for example, an optical element, such as one of the mirrors 110, 112, 114, 116, 118, 122, 130, M1 to M6, one of the lens elements 128 or a stop. However, the first element 202 can also be a force frame, an adjusting element or actuator for aligning an optical element, an end stop of an optical element, part of an active vibration isolation system (AVIS), such as for suspension of a sensor frame, or similar.

The optical system 200 moreover includes a second element 204. The second element 204 can be a base of the optical system 200. The base can also be designated as a fixed world of the optical system 200. For example, the second element 204 can also be an aforementioned force frame of the optical system 200 or of the EUV lithography apparatus 100A. In this case, the first element 202 can be, for example, an optical element as explained above, which is carried or supported by the second element 204.

The first element 202 has in particular six degrees of freedom with respect to the second element 204, namely three translational degrees of freedom along an x direction x, a y direction y and a z direction z, respectively, and three rotational degrees of freedom about the x direction x, the y direction y and the z direction z, respectively. In other words, a position and an orientation of the first element 202 can be determined or described with the aid of the six degrees of freedom. The directions x, y, z can also be designated as spatial directions.

The "position" of the first element 202 is to be understood in particular as its coordinates or the coordinates of a measurement point provided on the first element 202 with respect to the x direction x, the y direction y and the z direction z. The "orientation" of the first element 202 is to be understood in particular as its tilt with respect to the three spatial directions x, y, z. In other words, the first element 202 can be tilted about the x direction x, the y direction y and/or the z direction z. This gives the six degrees of freedom for the position and/or orientation of the first element 202. A "location" of the first element 202 includes both its position and its orientation.

An interface 206 is provided between the first element 202 and the second element 204. The first element 202 is coupled to the second element 204 at the interface 206. A surface 208 of the first element 202 and a surface 210 of the second element 204 are assigned to the interface 206. The surfaces 208, 210 face towards each other.

Before the optical system 200 is started up, for example before exposure operation, it is desirable to adapt the position and/or orientation of the first element 202. For this purpose, for example, the first element 202 can be adjusted or oriented in a coordinate system defined by the spatial directions x, y, z, or the first element 202 is adjusted or oriented relative to the second element 204.

In the present case, "adjusting" can be understood as bringing the first element 202 from an actual position IL (shown in FIG. 2 with solid lines and labelled with the reference sign 202) to a nominal position SL (shown in FIG. 2 with broken lines and labelled with the reference signs 202'). The actual position IL can be measured, for example, and the nominal position SL can be calculated, for example, such as with the aid of a correction recipe.

The adjustment of the first element 202 can be effected, for example, with the aid of spacers. For this purpose, desired thicknesses or heights of such spacer elements are first of all determined, for example with the aid of a virtual assembly model or with the aid of short-circuit measurements. A "short-circuit measurement" is to be understood in the present case as meaning that the optical system 200 is assembled completely with standard or nominal spacers and then measured.

In order to avoid long processing times, for example on account of the grinding of the spacers, a modular system of spacers of very different heights or thicknesses is made available. The spacers are ground here with a precision of ±2 μm, in order to achieve the desired process tolerances. A plurality of spacers can be combined to form a spacer stack. On account of the small increments of 10 μm and the usual desire for a large adjustment range of up to 0.5 mm, it is desirable to make available a large number of spacers. For example, over 1000 spacers have to be kept in stock for a projection system 104 of the kind explained above. The complicated handling and the logistics of the spacers drive up the costs. Moreover, long processing times have to be expected. The production and cleaning of high-precision spacers is also very complex.

In order to make adjustment easier in relation to known spacers, a tunable spacer 300 is provided at the interface 206. With the spacer 300 shown in FIG. 2, the position of the first element 202 in the z direction can be adjusted. A large number of spacers 300 of this kind can be provided, such that the position and/or orientation of the first element 202 can be adjusted with respect to the second element 204. A fastening element 212, for example a screw, can be guided through the spacer 300. The spacer 300 can be assigned a coordinate system formed by the three spatial directions x, y, z. That is to say, the spatial directions x, y, z are assigned to the spacer 300. The first element 202 has a weight G that rests on the spacer 300. In this way, the first element 202 loads the spacer 300 with its weight G.

Figure 3:
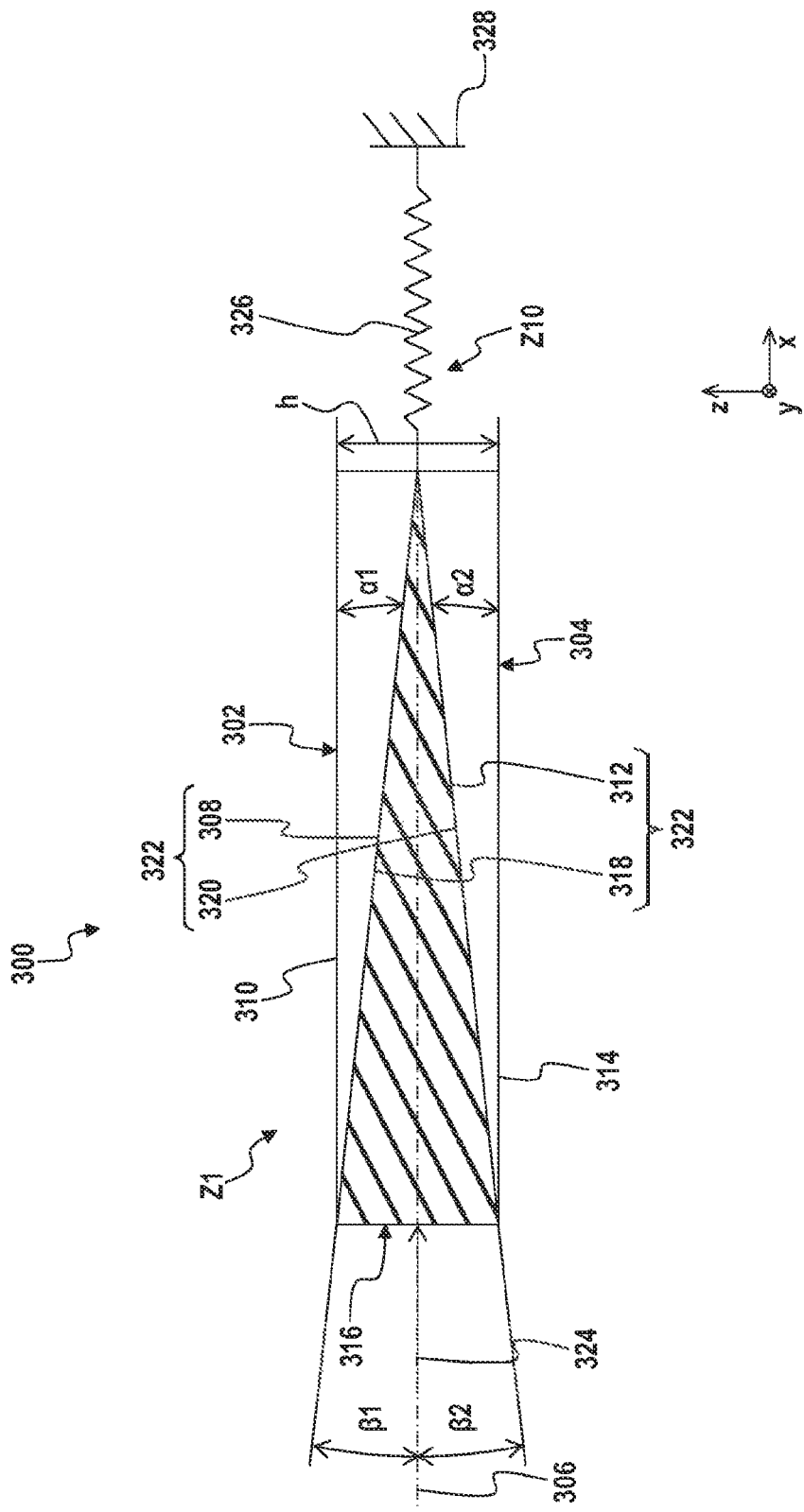
FIG. 3 shows a schematic view of an embodiment of a tunable spacer for the optical system according to FIG. 2.
Figure 4:
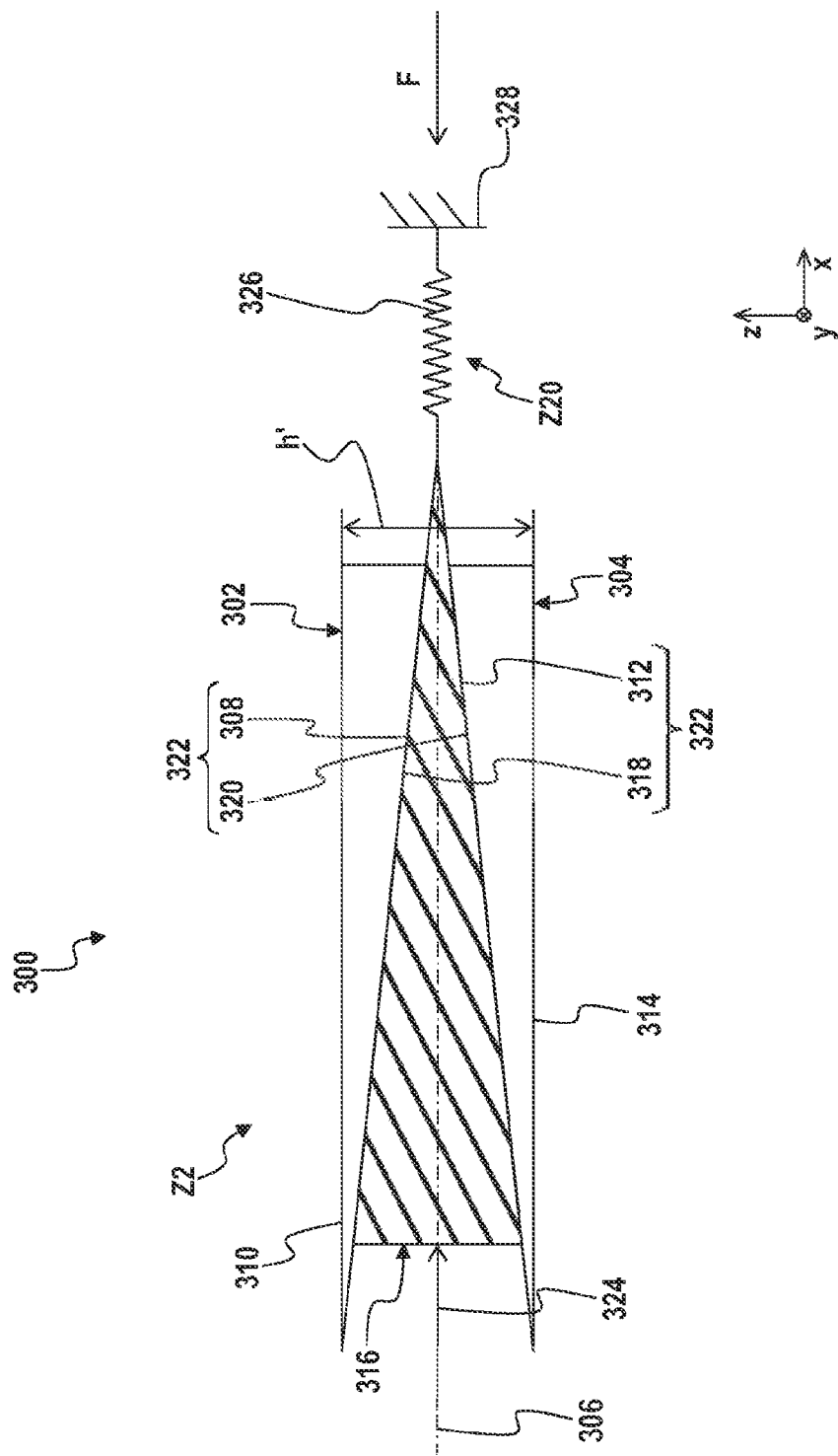
FIG. 4 shows a further schematic view of the tunable spacer according to FIG. 3.

FIGS. 3 and 4 show an embodiment of the spacer 300. The spacer 300 includes a first housing element 302 and a second housing element 304. The housing elements 302, 304 can be of identical configuration. The housing elements 302, 304 can be positioned with mirror symmetry in relation to a plane of symmetry 306.

The first housing element 302 includes a first gliding plane or first gliding surface 308, which is inclined at a first angle of inclination $\alpha 1$ relative to an outer face 310 of the first housing element 302. The angle of inclination $\alpha 1$ is can be smaller than 10°, for example 5° to 8°. Accordingly, the second housing element 304 has a second gliding plane or second gliding surface 312, which is inclined at a second angle of inclination $\alpha 2$ relative to an outer face 314 of the second housing element 304. The angles of inclination $\alpha 1$, $\alpha 2$ can be of the same size. Alternatively, the angles of inclination $\alpha 1$, $\alpha 2$ can also be of different size. The outer faces 310, 314 bear on the surfaces 208, 210 of the elements 202, 204. The angles of inclination $\alpha 1$, $\alpha 2$ can also be designated as wedge angles.

The spacer 300 moreover includes a displacement element 316 arranged between the housing elements 302, 304 and linearly displaceable relative to the latter. The displacement element 316 is wedge-shaped. Therefore, the displacement element 316 can also be designated as a wedge element. The displacement element 316 can be configured with mirror symmetry in relation to the plane of symmetry 306.

The displacement element 316 includes a first gliding plane or first gliding surface 318, which bears and can slide on the first gliding surface 308 of the first housing element 302. The displacement element 316 moreover includes a second gliding plane or second gliding surface 320, which bears and can slide on the second gliding surface 312 of the second housing element 304. The gliding surfaces 318, 320 are positioned with mirror symmetry in relation to the plane of symmetry 306.

The first gliding surface 318 is inclined relative to the plane of symmetry 306 at a first angle of inclination $\beta 1$, which can be equal to the first angle of inclination $\alpha 1$. The second gliding surface 320 is inclined relative to the plane of symmetry 306 at a second angle of inclination $\beta 2$, which can be equal to the second angle of inclination $\alpha 2$. In the case where the angles of inclination $\alpha 1$, $\alpha 2$ are of different sizes, the angles of inclination $\beta 1$, $\beta 2$ are also of different sizes, although the first angles of inclination $\alpha 1$, $\beta 1$ and the second angles of inclination $\alpha 2$, $\beta 2$ are in each case of the same size. For example, the first angles of inclination $\alpha 1$, $\beta 1$ or the second angles of inclination $\alpha 2$, $\beta 2$ can also be equal to 0°, such that the corresponding gliding surfaces 308, 318 or 312, 320 are positioned parallel to the plane of symmetry 306. The angles of inclination $\beta 1$, $\beta 2$ can also be designated as wedge angles.

The gliding surfaces 308, 312, 318, 320 are part of a gear mechanism 322 of the spacer 300. The gear mechanism 322 is designed to convert a linear movement of the displacement element 316 in a spatial direction, for example in the x direction x, into a linear movement of at least one of the housing elements 302, 304 in a spatial direction differing from the spatial direction in which the displacement element 316 is shifted, for example the z direction z. That is to say, in the orientation in FIG. 3, the gliding surfaces 308, 312, 318, 320 slide on each other during a linear shift of the displacement element 316 in the x direction x, as a result of which the housing elements 302, 304 move away from each other, viewed in the z direction z. In this way, a height h of the spacer 300, which is oriented parallel to the z direction z in the orientation of FIG. 3, can be adjusted. The height h can also be designated as a thickness. The linear movement of the displacement element 316 relative to the housing elements 302, 304 is illustrated in FIGS. 3 and 4 with the aid of an arrow 324.

The spacer 300 can moreover include an optional spring element 326. The spring element 326 can be a cylindrical spring, such as a compression spring. The spring element 326 is positioned between the displacement element 316 and a fixed bearing 328. For example, the spring element 326 couples the displacement element 316 to the fixed bearing 328. The fixed bearing 328 can be, for example, part of the housing elements 302, 304 of the spacer 300.

The spacer 300 can be brought from a non-deflected state Z1, shown in FIG. 3, to a deflected state Z2, shown in FIG. 4, and vice versa. The height h is greater in the deflected state Z2 than in the non-deflected state Z1. Between the states Z1, Z2, the spacer 300 can be brought steplessly to any desired number of intermediate states. As the spacer 300 is brought from the non-deflected state Z1 to the deflected state Z2, and vice versa, the gliding surface 308 slides on the gliding surface 318, and the gliding surface 312 slides on the gliding surface 320. In the non-deflected state Z1, the height is labelled with the reference sign h, and, in the deflected state, the height is labelled with the reference sign h', wherein the height h' is greater than the height h.

As the spacer 300 is brought from the non-deflected state Z1 to the deflected state Z2, the spring element 326 is brought reversibly from an uncompressed or untensioned state Z10 to a compressed or tensioned state Z20. In the tensioned state Z20, the spring element 326 exerts a spring force F, such as a compressive force, on the displacement element 316, such that the displacement element 316 is pretensioned in the direction of the non-deflected state Z1.

Figure 5:
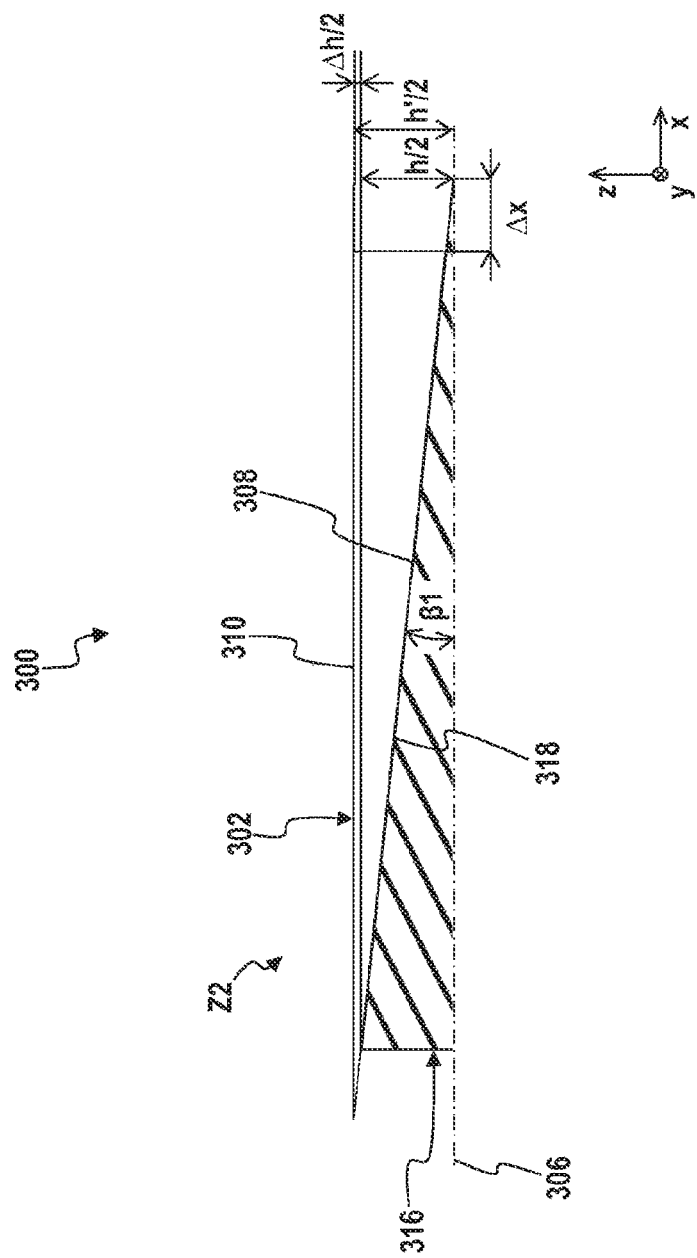
FIG. 5 shows a further schematic view of the tunable spacer according to FIG. 3.

FIG. 5 shows a further schematic view of the spacer 300, wherein only half of the displacement element 316 is shown, and the second housing element 304 is not shown at all. The first housing element 302 is shown with hatching for better differentiation from the displacement element 316. As mentioned before, the displacement element 316 is moved linearly relative to the housing elements 302, 304 in order to adjust the height h. With the aid of the gear mechanism 322, a linear movement of the displacement element 316 along a spatial direction, for example along the x direction x, by a displacement path $\Delta x$, can be converted into a linear movement, i.e. a height change $\Delta h$, of the housing elements 302, 304 in another spatial direction, for example in the z direction z.

In the geometry shown in FIG. 5, $\tan \beta 1 = (\Delta h/2)/\Delta x$ or $\tan \alpha 1 = (\Delta h/2)/\Delta x$. With a displacement path $\Delta x$ of the displacement element 316 along the x direction x by 1 mm for example, and assuming an angle of inclination $\beta 1$ of 5°, this gives the height change $\Delta h = 2 \tan \beta 1 \Delta x = 175$ µm in the case where the displacement element 316 has two gliding surfaces 318, 320. The smaller the angle of inclination $\alpha 1$, $\alpha 2$, $\beta 1$, $\beta 2$, the less the height change $\Delta h$ for a constant displacement path $\Delta x$. In the case where the displacement element 316 has only one gliding surface 318, 320, the height change $\Delta h$ halves for the same displacement path $\Delta x$. The smaller the angle of inclination $\alpha 1$, $\alpha 2$, $\beta 1$, $\beta 2$, the smaller the adjustment increments that are to be realized.

The shallow angle of inclination $\alpha 1$, $\alpha 2$, $\beta 1$, $\beta 2$ also increases the static friction between the displacement element 316 and the housing elements 302, 304. The spacer 300 is therefore self-locking. That is to say, the spacer 300 cannot be brought from the deflected state Z2 to the non-deflected state Z1 by application of forces to the outer faces 310, 314 of the housing elements 302, 304. Therefore, compared to a non-adjustable spacer, the spacer 300 is no less stiff and, moreover, has no lesser stability.

Figure 6:
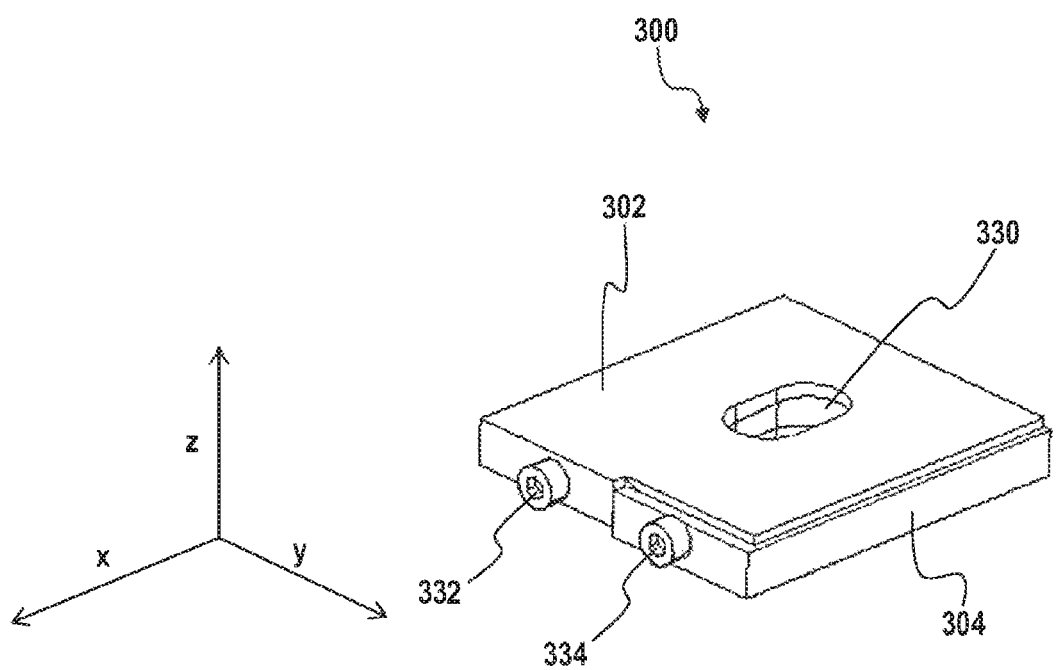
FIG. 6 shows a schematic perspective view of the tunable spacer according to FIG. 3.
Figure 9:
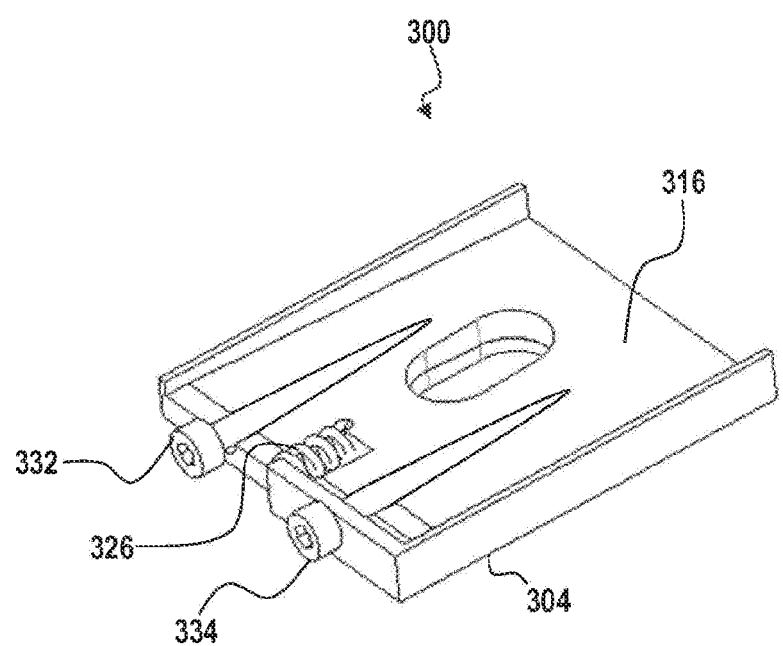
FIG. 9 shows a schematic perspective partial view of the tunable spacer according to FIG. 3.

FIG. 6 shows a specific design of the spacer 300 in a schematic perspective view. FIG. 9 shows a schematic perspective partial view of the spacer 300. The spacer 300 includes a perforation 330 which passes through the two housing elements 302, 304 and also the displacement element 316. The perforation 330 can have an elongate geometry, which can extend in the x direction x. That is to say, an extent of the perforation 330 along the x direction x is greater than its extent along the y direction y. The fastening element 212 can be guided through the perforation 330. In this way, the fastening element 212 does not need to be arranged next to the spacer 300, which could lead to a bending stress of the first element 202. The perforation 330 is provided substantially centrally on the spacer 300.

The spacer 300 includes two adjustment elements 332, 334. The adjustment elements 332, 334 could be screws, such as cap screws. A first adjustment element 332 and a second adjustment element 334 are provided. The adjustment elements 332, 334 can be part of the gear mechanism 322. With the aid of the adjustment elements 332, 334, the displacement element 316 can be moved linearly along the displacement path $\Delta x$ counter to the spring force F of the spring element 326, in order to bring the spacer 300 from the non-deflected state Z1 to the deflected state Z2. The adjustment elements 332, 334 can be actuated alternately.

To bring the spacer 300 from the deflected state Z2 to the non-deflected state Z1, the adjustment elements 332, 334 are released again, as a result of which the spring element 326 again brings the spacer 300 automatically from the deflected state Z2 to the non-deflected state Z1.

In the case where the spacer 300 has no spring element 326, the spacer 300 can also be brought from the deflected state Z2 to the non-deflected state Z1 by a striking action against the loosened adjustment elements 332, 334. Moreover, the spacer 300 can also alternatively include only one adjustment element 332, 334.

Figure 7:
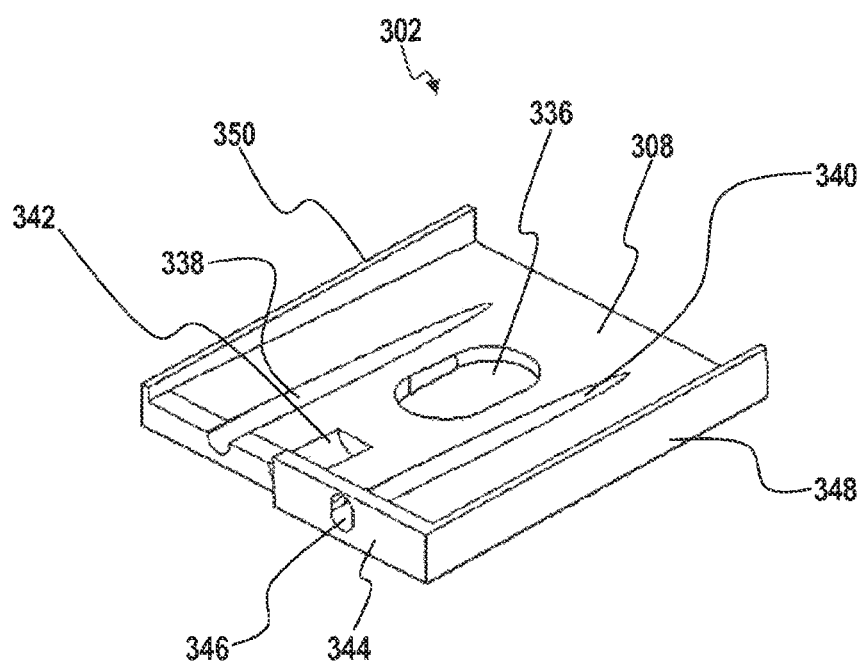
FIG. 7 shows a schematic perspective view of an embodiment of a housing element for the tunable spacer according to FIG. 3.

The first housing element 302 shown in a schematic perspective view in FIG. 7 has a configuration identical to the second housing element 304. The first gliding surface 308 and the outer face 310 of the first housing element 302 are penetrated by a perforation 336. The perforation 336 is part of the perforation 330. Grooves 338, 340 for the adjustment elements 332, 334 are provided in the first gliding surface 308 on both sides of the perforation 336. Moreover, a receiving region 342 for the spring element 326 is provided on the first gliding surface 308. The receiving region 342 can be semi-cylindrical. The first housing element 302 can be produced from a metal material, for example from a steel alloy or an aluminium alloy.

The first housing element 302 moreover includes a rear wall 344 with a perforation 346 through which the second adjustment element 334 is guided. The aforementioned fixed bearing 328 of the spring element 326 can be part of the rear wall 344. The first housing element 302 has a first guide rail 348, and a second guide rail 350 arranged parallel to and at a distance from the first guide rail 348. The guide rails 348, 350 can also be designated as guide surfaces or guide walls. As FIG. 6 shows, the second guide rail 350 of the first housing element 302 is guided internally on the first guide rail 348 of the second housing element 304. Accordingly, the second guide rail 350 of the second housing element 304 is guided internally on the first guide rail 348 of the first housing element 302. In this way, the housing elements 302, 304 cannot twist counter to each other.

Figure 8:
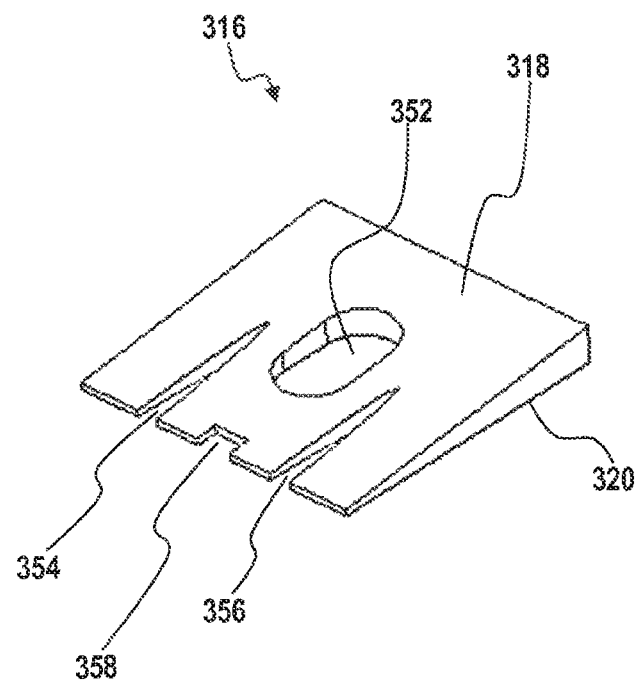
FIG. 8 shows a schematic perspective view of an embodiment of a displacement element for the tunable spacer according to FIG. 3.

The displacement element 316 shown in a schematic perspective view in FIG. 8 likewise includes a perforation 352 which passes through the gliding surfaces 318, 320 and is part of the perforation 330. Moreover, the displacement element 316 has a first receiving portion 354 for the first adjustment element 332 and a second receiving portion 356 for the second adjustment element 334. The receiving portions 354, 356 can partially perforate the gliding surfaces 318, 320.

Each receiving portion 354, 356 has a threaded bore (not shown) into which the respective adjustment element 332, 334 can be screwed. A receiving region 358, which is formed as a perforation, serves to receive the spring element 326. The displacement element 316 can be produced from a metal material, for example from a steel alloy or an aluminium alloy.

The spacer 300 has many advantages over known spacers. The accuracy of the adjustment of the height h is not achieved through high-precision and therefore costly production, but with the aid on a non-sensitive adjustment mechanism in the form of the gear mechanism 322. It is not necessary to exchange the spacer 300 in order to adjust the height h. Rather, lateral access to the adjustment elements 332, 334 is sufficient to adjust the height h. With the spacer 300, it is possible to achieve at least the same adjustment accuracy, that is to say the graduation of the height h, as is possible with the aforementioned modular concept. The spacer 300 provides stiffness and stability that are no poorer than those of a known spacer stack.

Figure 10:
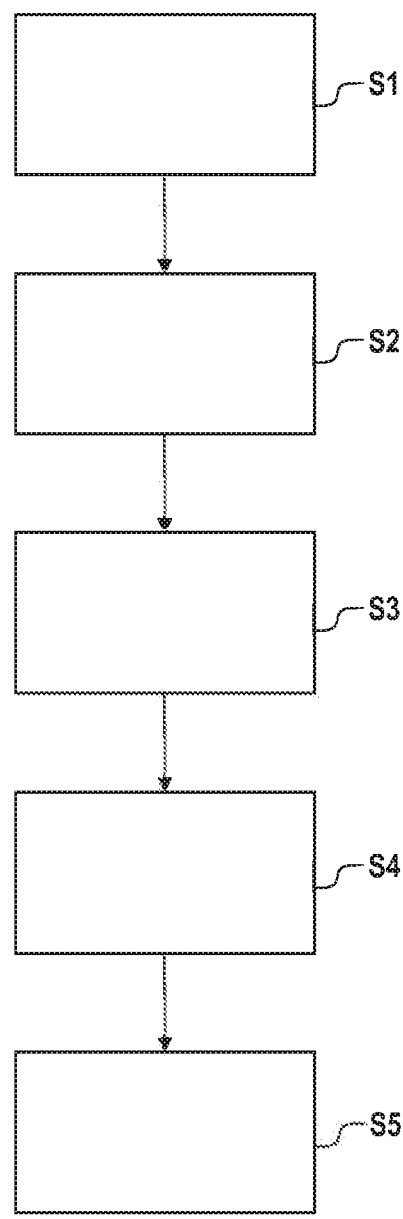
FIG. 10 shows a schematic block diagram of one embodiment of a method for adjusting a first element of the EUV lithography apparatus according to FIG. 1A or for the DUV lithography apparatus according to FIG. 1B toward a second element of the lithography apparatus.

FIG. 10 shows a schematic block diagram of one embodiment of a method for adjusting the first element 202 toward the second element 204.

In a step S1, the actual location IL of the first element is determined. After that, the nominal location SL of the first element 202 is determined in a step S2. In a step S3, the spacer 300 is unloaded. This can be done by lifting the first element 202 from the spacer 300. Consequently, the height h of the spacer 300 is adjusted in a step S4 in order to bring the first element 20 from the actual location IL into the nominal location SL. This can be done while leaving the spacer 300 sandwiched between the two elements 202, 204. Finally, the spacer 300 is loaded again in a step S5. For example, the spacer 300 is loaded with the weight G of the first element 202.

Although the present disclosure has been described on the basis of illustrative embodiments, it is modifiable in diverse ways.

LIST OF REFERENCE SIGNS

100A EUV lithography apparatus
100B DUV lithography apparatus
102 beam shaping and illumination system
104 projection system
106A EUV light source
106B DUV light source
108A EUV radiation
108B DUV radiation
110 mirror
112 mirror
114 mirror
116 mirror
118 mirror
120 photomask
122 mirror
124 wafer
126 optical axis
128 lens element
130 mirror
132 medium
200 optical system
202 element
202' element
204 element
206 interface
208 surface
210 surface
212 fastening element
300 spacer
302 housing element
304 housing element
306 plane of symmetry
308 gliding surface
310 outer face
312 gliding surface
314 outer face
316 displacement element
318 gliding surface
320 gliding surface
322 gear mechanism
324 arrow
326 spring element
328 fixed bearing
330 perforation
332 adjustment element
334 adjustment element
336 perforation
338 groove
340 groove
342 receiving region
344 rear wall
346 perforation
348 guide rail
350 guide rail
352 perforation
354 receiving portion
356 receiving portion
358 receiving region
F spring force
G weight
h height
h' height
IL actual position
M1 mirror
M2 mirror
M3 mirror
M4 mirror
M5 mirror
M6 mirror
SL nominal position
S1 step
S2 step
S3 step
S4 step
S5 step
x spatial direction
y spatial direction
z spatial direction
Z1 state
Z2 state
Z10 state
Z20 state
$\alpha 1$ angle of inclination
$\alpha 2$ angle of inclination β1 angle of inclination
β2 angle of inclination
Δh height change
Δx displacement path

What is claimed is:

1. A method of adjusting a first element of a lithography apparatus relative to a second element of the lithography apparatus via a tunable spacer arranged between the first and second elements, the method comprising:
   a) removing at least a portion of a weight of the first element from the tunable spacer;
   b) while the weight of the first element is at least partially removed from the tunable spacer, adjusting a height of the tunable spacer so that the tunable spacer has an adjusted height; and
   c) while the tunable spacer has the adjusted height, putting the weight of the first element on the tunable spacer to adjust the first element relative to the second element,
   wherein:
      before a) while the weight of the first element is on the tunable spacer, the first element has a first location;
      after c) while the weight of the first element is on the tunable spacer, the first element has a second location; and
      the second location of the first element is different from the first location of the first element.

2. The method of claim 1, further comprising, before a):
   determining the first location of the first element; and
   determining the second location of the first element.

3. The method of claim 2, wherein determining the first location of the first element comprises measuring the first location of the first element or calculating the first location of the first element.

4. The method of claim 2, wherein determining the second location of the first element comprises calculating the second location of the first element.

5. The method of claim 2, wherein determining the first location of the first element comprises determining the first location of the first element relative to the second element.

6. The method of claim 1, wherein b) comprises steplessly adjusting the height of the tunable spacer.

7. The method of claim 1, wherein a) comprises lifting the first element from the tunable spacer to at least partially remove the weight of the first element from the tunable spacer.

8. The method of claim 1, wherein c) comprises settling the first element on the tunable spacer to put the weight of the first element on the tunable spacer.

9. The method of claim 1, wherein b) comprises using a gear mechanism to adjust the height of the tunable spacer, wherein the gear mechanism comprises a part of the tunable spacer.

10. The method of claim 9, wherein b) comprises adjusting the height of the tunable spacer via a linear movement of a displacement element of the tunable spacer relatively toward a housing element of the tunable spacer along a first spatial direction.

11. The method of claim 10, wherein, during b), the gear mechanism transfers the linear movement of the displacement element along the first spatial direction into a linear movement of the displacement element along a second spatial direction different from the first spatial direction.

12. The method of claim 10, further comprising, during the linear movement of the displacement element relatively toward the housing element, gliding an inclined gliding surface of the displacement element on an inclined gliding surface of the housing element.

13. The method of claim 10, further comprising using an adjustment element to move the displacement element relatively toward the housing element along the first spatial direction.

14. The method of claim 1, wherein b) comprises bringing the tunable spacer from a non-deflected status into a deflected status, and a height of the tunable spacer in the deflected status is greater than a height of the tunable spacer the non-deflected status.

15. The method of claim 1, comprising keeping the tunable spacer between the first and second elements throughout a) to c).

16. The method of claim 1, wherein, during c), the tunable spacer is force-free.

17. The method of claim 1, wherein:
   a) comprises lifting the first element from the tunable spacer to at least partially remove the weight of the first element from the tunable spacer; and
   b) comprises steplessly adjusting the height of the tunable spacer.

18. The method of claim 17, wherein c) comprises settling the first element on the tunable spacer to put the weight of the first element on the tunable spacer.

19. The method of claim 18, further comprising, before a):
   determining the first location of the first element; and
   determining the second location of the first element.

20. The method of claim 1, wherein:
   a) comprises lifting the first element from the tunable spacer to at least partially remove the weight of the first element from the tunable spacer;
   b) comprises using a gear mechanism to adjust the height of the tunable spacer; and
   the gear mechanism comprises a part of the tunable spacer.

* * * * *

UNITED STATES PATENT AND TRADEMARK OFFICE
CERTIFICATE OF CORRECTION

PATENT NO. : 11,460,780 B2
APPLICATION NO. : 17/228150
DATED : October 4, 2022
INVENTOR(S) : Boaz Pnini It is certified that error appears in the above-identified patent and that said Letters Patent is hereby corrected as shown below:

In the Specification

Column 1, Line 30, before "system" delete --zo--.

Column 7, Line 33, delete "$\Delta h = 2 \tan \beta 1 \Delta x$" insert --$\Delta h = 2\tan\beta 1 \Delta x$--.

Column 13, Line 49, delete "$\tan \beta 1$" insert --$\tan\beta 1$--.

Column 13, Line 49-50, delete "$\tan \alpha 1$" insert --$\tan\alpha 1$--.

Column 13, Line 53, delete "$2 \tan \beta 1 \Delta x = 175$" insert --$2\tan\beta 1 \Delta x = 175$--.

In the Claims

Column 18, Line 25, Claim 14, before "the" insert --in--.

Signed and Sealed this
Twentieth Day of December, 2022

Katherine Kelly Vidal
*Director of the United States Patent and Trademark Office*